(12) United States Patent
An et al.

(10) Patent No.: US 9,653,483 B2
(45) Date of Patent: May 16, 2017

(54) DISPLAY MOTHERBOARD, DISPLAY PANEL AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Yang An, Beijing (CN); Zhilong Peng, Beijing (CN); Wukun Dai, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/091,819

(22) Filed: Apr. 6, 2016

(65) Prior Publication Data

US 2016/0322394 A1    Nov. 3, 2016

(30) Foreign Application Priority Data

Apr. 30, 2015   (CN) .......................... 2015 1 0218079

(51) Int. Cl.
    *H01L 27/12*    (2006.01)
(52) U.S. Cl.
    CPC ................ *H01L 27/1218* (2013.01)
(58) Field of Classification Search
    CPC .......... G02F 1/133351; H01L 27/1218; H01L 23/3142
    See application file for complete search history.

(56) References Cited

U.S. PATENT DOCUMENTS

2009/0015779 A1*  1/2009  Ohashi .................. G02F 1/1341
                                                        349/154
2011/0133666 A1*  6/2011  Arai ..................... H01L 27/1214
                                                        315/291

(Continued)

FOREIGN PATENT DOCUMENTS

CN          102122102 A        7/2011
CN          103207480 A        7/2013

(Continued)

OTHER PUBLICATIONS

First Office Action dated Mar. 10, 2017 corresponding to Chinese application No. 201510218079.X.

*Primary Examiner* — Bilkis Jahan
*Assistant Examiner* — Victor Barzykin
(74) *Attorney, Agent, or Firm* — Nath, Goldberg & Meyer; Joshua B. Goldberg

(57) ABSTRACT

The invention provides a display motherboard, a display panel and a display device for solving the problem of unsmooth cutting of the display motherboard in the prior art during cutting. In the display motherboard, the display panel and the display device provided by the present invention, a cutting area of the display motherboard is provided with a raised portion on one side close to sealant, and the raised portion can make the cutting stress more concentrated when the display motherboard is cut, so that adhesion of the sealant to substrates is reduced and thus the display motherboard is cut more smoothly.

11 Claims, 2 Drawing Sheets

(56) References Cited

U.S. PATENT DOCUMENTS

2014/0092351 A1* 4/2014 Hatakeyama ......... G02F 1/1339
349/106
2014/0307208 A1* 10/2014 Hatakeyama ....... G02F 1/13394
349/106

FOREIGN PATENT DOCUMENTS

| CN | 104102037 A | 10/2014 |
| --- | --- | --- |
| CN | 204536692 U | 8/2015 |

* cited by examiner

DISPLAY MOTHERBOARD, DISPLAY PANEL AND DISPLAY DEVICE

FIELD OF THE INVENTION

The present invention relates to the field of display technology, and specifically relates to a display motherboard, a display panel and a display device.

BACKGROUND OF THE INVENTION

FIG. 1 shows a schematic top view of a display motherboard in the prior art, and FIG. 2 shows a schematic diagram of a section structure of a cutting area of the display motherboard in the prior art. As shown in FIGS. 1 and 2, in a manufacturing process of display panels 2, the display panels 2 are generally obtained by cutting a display motherboard 1, wherein the display motherboard 1 includes a plurality of display panels 2 arranged in a matrix. Specifically, the display motherboard 1 includes: a first substrate and a second substrate which are arranged oppositely; and sealant 3 arranged between the first substrate and the second substrate and used for sealing and bonding of the first substrate and the second substrate, wherein the sealant 3 defines a plurality of display panels 2 arranged in a matrix on the display motherboard 1. For example, the first substrate may be an array substrate, and the second substrate may be a color filter substrate 6. In this case, the display motherboard 1 further includes a cutting area 4 formed on the array substrate and corresponding to the sealant 3. Generally, the projection of the cutting area 4 on the array substrate is positioned within the projection of the sealant 3 on the array substrate, so that separated display panels 2 can be obtained by cutting the display motherboard 1 along the cutting area 4.

However, in the prior art, a few functional layers (relative to the functional layers remained at a portion, corresponding to the display areas of the display panels 2, of the array substrate) are remained at a portion, corresponding to the cutting area 4, of the array substrate, for example, as shown in FIG. 2, only some insulating layers (e.g., a planarization layer 7 and a gate insulating layer 8) are remained at the portion, corresponding to the cutting area 4, of the array substrate, while a source-drain layer, a gate layer and the like are not remained, so the distance between the portions, corresponding to the cutting area 4, of the array substrate and the color filter substrate 6 is relatively long, with thick sealant 3 coated therebetween, and during cutting, the display motherboard 1 is difficult to cut smoothly, and the sealant 3 is easily adhered to the substrates on two sides. Meanwhile, the functional layers (e.g., the planarization layer 7) remained at the portion, corresponding to the cutting area 4, of the array substrate are planar, so when the display motherboard 1 is cut by a cutter in the cutting area, the stress generated when the cutter cuts the display motherboard 1 is relatively dispersive; meanwhile, when the planarization layer 7, the gate insulating layer 8 and the like are greatly deformed under the stress to buffer the stress generated by the cutter, so that the stress is relatively small and unfavorable for cutting, and the display motherboard 1 is difficult to cut with a relatively small cutting driving force.

SUMMARY OF THE INVENTION

In view of the above problems, an object of the present invention is to provide a display motherboard, a display panel and a display device.

The present invention provides a display motherboard, including: a first substrate and a second substrate which are arranged oppositely; sealant arranged between the first substrate and the second substrate and used for sealing and adhering of the first substrate and the second substrate, wherein the sealant defines a plurality of display panels arranged in a matrix on the display motherboard; and a cutting area provided on the first substrate and corresponding to the sealant, wherein the cutting area is provided with a raised portion on one side thereof facing the sealant.

Preferably, a cross section of the raised portion in the direction perpendicular to the first substrate is of a trapezoid, and a short bottom edge of the trapezoid is close to the sealant.

Preferably, a bottom angle, away from the sealant, of the trapezoidal cross section of the raised portion in a direction perpendicular to the first substrate is more than or equal to 60° and less than 90°.

Preferably, the raised portion includes a plurality of functional layers laminated successively on the first substrate, and the projection of a functional layer close to the first substrate on the first substrate covers that of the adjacent functional layer away from the first substrate on the first substrate.

Preferably, the functional layer, in contact with the sealant, of the raised portion is a metal or metal oxide layer.

Preferably, widths of the functional layers, in contact with the sealant, of the raised portion between two adjacent display panels are more than 2.5 μm.

Preferably, the display motherboard further includes grooves on two sides of the raised portion.

Preferably, a side wall of one side, adjacent to the raised portion, of each groove is the one of the raised portion.

Preferably, widths of the bottom edges of the grooves away from the second substrate are more than 2.5 μm.

Preferably, the raised portion includes a gate layer, a gate insulating layer, a source-drain layer and a planarization layer laminated successively on the first substrate.

The present invention further provides a display panel, which is obtained by cutting the above display motherboard along the raised portion of the cutting area.

The present invention further provides a display device, including the above display panel.

In the display motherboard, the display panel and the display device provided by the present invention, the cutting area of the display motherboard is provided with a raised portion on one side thereof close to the sealant, and the raised portion can make the cutting stress more concentrated when the display motherboard is cut, so that adhesion of the sealant to the substrates is reduced and thus the display motherboard is cut more smoothly.

Figure 1:
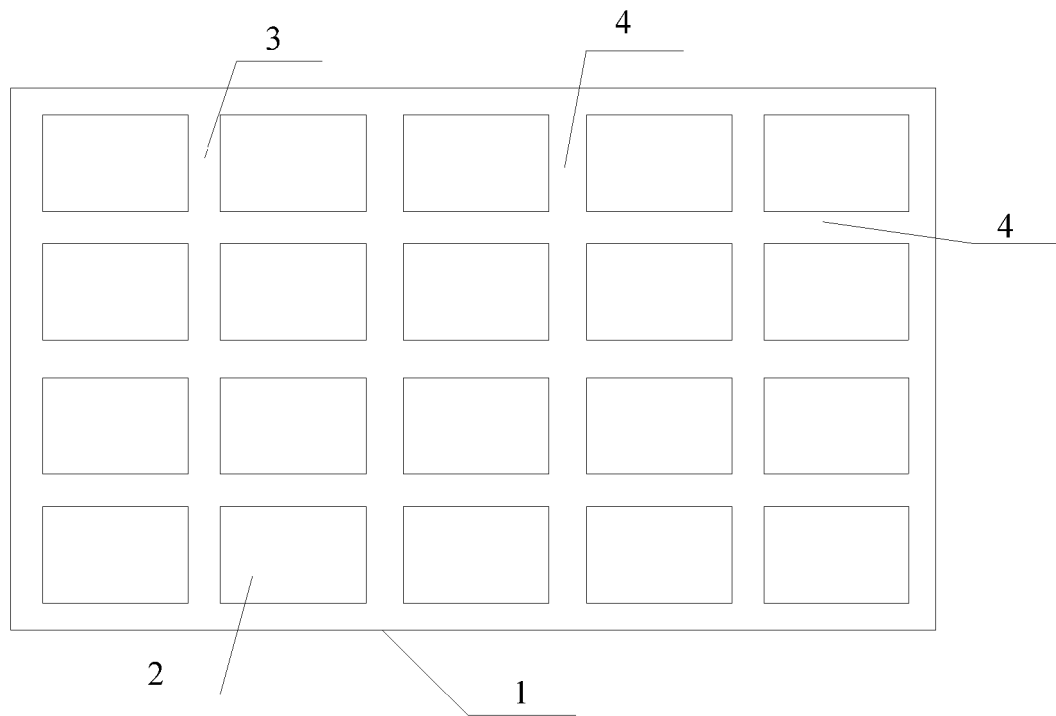
FIG. 1 shows a schematic top view of a display motherboard in the prior art.
Figure 2:
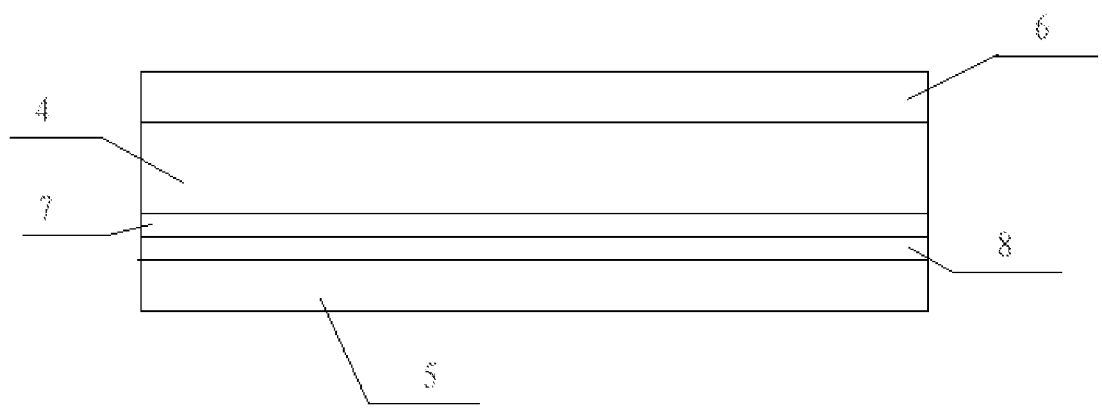
FIG. 2 shows a schematic diagram of a section structure of a cutting area of the display motherboard in the prior art.

Reference Numerals: 1, display motherboard; 2, display panel; 3, sealant; 4, cutting area; 5, glass substrate; 6, color filter substrate; 7, planarization layer; 8, gate insulating layer; 9, source-drain layer; 10, gate layer; 11, array substrate; 12, raised portion; 13, groove;

d1: width of the raised portion away from the bottom edge of the sealant;

d2: width of the groove away from the bottom edge of the sealant.

DESCRIPTION OF THE PREFERRED EMBODIMENT

In order that those skilled in the art can better understand the technical solutions of the present invention, the present invention will be further described in detail below in conjunction with the accompanying drawings and specific embodiments.

First Embodiment

Figure 3:
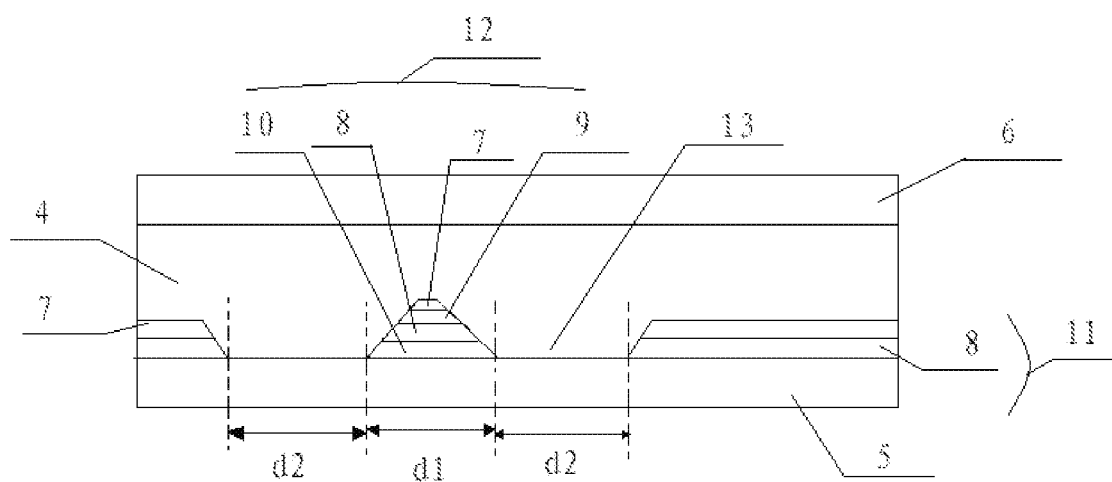
FIG. 3 shows a schematic diagram of a section structure of a cutting area of a display motherboard in a first embodiment of the present invention.

FIG. 3 shows a schematic diagram of a section structure of a cutting area of a display motherboard in a first embodiment of the present invention. As shown in FIG. 3, this embodiment provides a display motherboard 1, including: a first substrate and a second substrate which are arranged oppositely; and sealant 3 arranged between the first substrate and the second substrate and used for sealing and adhering of the first substrate and the second substrate, wherein the sealant 3 defines a plurality of display panels 2 (referring back to FIG. 1) arranged in a matrix on the display motherboard 1. In this embodiment, the first substrate is an array substrate 11, and the second substrate is a color filter substrate 6. In this case, the display motherboard 1 further includes: a cutting area formed on the array substrate 11 and corresponding to the sealant 3, wherein the cutting area is provided with a raised portion 12 on one side facing the sealant 3.

In this embodiment, as the cutting area is provided with a raised portion 12 on one side facing to the sealant 3, and the raised portion 12 can make the cutting stress more concentrated when the display motherboard 1 is cut, adhesion of the sealant 3 to the substrates on two sides is reduced and thus the display motherboard 1 is cut more smoothly.

Preferably, the cross section of the raised portion 12 in the direction perpendicular to the array substrate 11 is of a trapezoid, wherein the short bottom edge of the trapezoid is close to the sealant 3. It could be understood that, because the cross section of the raised portion 12 in the direction perpendicular to the array substrate 11 is of a trapezoid and the short bottom edge of the trapezoid is close to the sealant 3, when the display motherboard 1 is cut by a cutter in the cutting area, the direction of stress generated by the cutter through the raised portion 12 is perpendicular to the display motherboard 1, the cutting stress is relatively stable, and the resulting cut section is perpendicular to the display motherboard 1.

Preferably, the bottom angle, away from the sealant 3, of the trapezoidal cross section of the raised portion 12 is more than or equal to 60° and less than 90°. It should be understood that, under the condition that the bottom angle is less than 90°, the larger the bottom angle is, the sharper the raised portion 12 is, the larger the cutting stress generated at one end of the raised portion 12 close to the sealant 3 is, and the more favorable it is for smooth cutting, that is to say, if the manufacturing process permits, the bigger bottom angle, away from the sealant 3, of the trapezoidal cross section of the raised portion 12, when being less than 90, is better.

Preferably, the raised portion 12 includes a plurality of functional layers laminated successively on the array substrate 11, and the projection of a functional layer close to the array substrate 11 on the array substrate 11 covers that of the adjacent functional layer away from the array substrate 11 on the array substrate 11, that is, the projections of the functional layers of the raised portion 12 on the array substrate 11 are superposed and the projection areas are sequentially reduced in the direction facing the sealant 3, thus ensuring that the cross section of the formed raised portion 12 in the direction perpendicular to the array substrate 11 is trapezoidal.

Further, preferably, the functional layer, in contact with the sealant 3, of the raised portion 12 is a metal layer or metal oxide layer. It should be understood that, because the deformation of metal layer or metal oxide layer is low under stress, when the functional layer, in contact with the sealant 3, of the raised portion 12 is a metal layer or metal oxide layer and when the display motherboard 1 is cut by a cutter in the cutting area, the stress generated by the cutter through the raised portion 12 is relatively stable.

Specifically, the functional layers of the raised portion 12 may include a gate layer 10, a gate insulating layer 8, a source-drain layer 9 and a planarization layer 7 laminated successively on the array substrate 11, that is, when the array substrate 11 is manufactured, the raised portion 12 is formed by remaining the gate layer 10, the gate insulating layer 8, the source-drain layer 9 and the planarization layer 7 in the portion, corresponding to the cutting area, of the array substrate 11.

It should be understood that the planarization layer 7 in the portion, corresponding to the cutting area, of the array substrate 11 may also be removed, in this way, the functional layer, close to the sealant 3, of the formed raised portion 12 is the source-drain layer 9, so that the stress generated by the cutter through the raised portion 12 is stable. However, in this way, the height of the raised portion 12 is reduced, and whether the raised portion 12 includes the planarization layer 7 or not may be selected by those skilled in the art as required.

Preferably, widths of the functional layers, in contact with the sealant 3, of the raised portion 12 between two adjacent display panels 2 are more than 2.5 μm. That is to say, the smaller widths of the functional layers, in contact with the sealant 3, of the raised portion 12 between two adjacent display panels 2 are better, such that the stress generated by the cutter through the raised portion 12 is more concentrated when the display motherboard 1 is cut by the cutter in the cutting area, but the widths of the functional layers, in contact with the sealant 3, of the raised portion 12 between two adjacent display panels 2 are limited by the manufacturing process. For example, the widths should be more than the minimum exposable distance 2.5 μm of exposure equipment, and once the widths are too small, the raised portion may not be formed.

Preferably, the display motherboard 1 further includes grooves 13 on two sides of the raised portion 12. In order that the stress generated by the cutter through the raised portion 12 is more concentrated, all the functional layers on the two sides of the raised portion 12 are removed to form the grooves 13 in the manufacturing process of the array substrate 11.

Preferably, the side wall of one side, adjacent to the raised portion 12, of each groove 13 is the one of the raised portion 12. Thus, the stress generated by the cutter through the raised portion 12 is more concentrated.

Preferably, the widths of the bottom edges of the grooves 13 away from the color filter substrate 6 are more than 2.5 μm. In this way, the raised portion 12 can be sufficiently separated from other functional layers on two sides thereof, to ensure that the stress generated by the cutter through the raised portion 12 is concentrated in (i.e., merely acts on) the area (i.e., the cutting area), corresponding to the raised portion 12, of the display motherboard 1. That is to say, the widths of the grooves 13 between the raised portion 12 and the functional layers in the adjacent display panels 2 should not be too small and are preferably more than the minimum exposable distance 2.5 μm of exposure equipment, and once the widths are too small, the raised portion may not be formed, the raised portion 12 is connected or partially connected with the functional layers in the adjacent display panels 2, then the effective height of the raised portion 12 in the direction perpendicular to the array substrate is reduced, and effective stress is unlikely to form. Of course, the widths of the grooves 13 between the raised portion 12 and the functional layers in the adjacent display panels 2 should not be too large, because if the widths are too large, the grooves 13 would be too large, so that much sealant is needed for filling the grooves 13, and no beneficial effect is achieved, however the sealant is wasted.

A manufacturing method of the above display motherboard 1 will be described below.

It should be understood that the display panels 2 arranged in a matrix on the display motherboard 1 are manufactured by the same process steps, the manufacturing process of a display panel 2 is described below as an example, wherein manufacturing of all functional layers is described below with respect to the structure of the raised portion 12 of the cutting area, and the manufacturing process of each functional layer of the display panel 2 is well known and is not redundantly described herein.

Further referring to FIG. 3, the manufacturing method of the display motherboard 1 includes steps S1 to S6 in this embodiment.

S1: a gate metal layer film is deposited on a glass substrate 5, and the gate metal layer film is patterned through a patterning process to form a pattern of a gate layer 10 in the raised portion 12 of the cutting area, wherein the gate metal layer film on two sides of the gate layer 10 is removed by etching, the gate layer 10 in the area corresponding to the raised portion 12 is remained, and then the bottoms of grooves 13 are formed on the two sides of the gate layer 10. At the moment, the gate layer 10 is used as the bottom layer of the raised portion 12 (i.e., a functional layer away from the sealant 3), the width d1 of the gate layer 10 may be set according to specific conditions, and the widths d2 of the bottoms of the grooves 13 on the two sides of the gate layer 10 are more than the minimum exposable distance 2.5 μm of exposure equipment. In this step, patterning may be implemented by a mask for forming a gate.

S2: a gate insulating layer film is deposited on the glass substrate 5 subjected to the above step S1, and the gate insulating layer film is patterned through a patterning process to form a pattern of a gate insulating layer 8 in the raised portion 12 of the cutting area, wherein the gate insulating layer film on two sides of the gate insulating layer 8 is removed by etching, and the gate insulating layer 8 in the area corresponding to the raised portion 12 is remained, wherein the width of the gate insulating layer 8 is smaller than or equal to that of the gate layer 10.

S3: an active layer film is deposited on the glass substrate 5 subjected to the above step S2, the active layer film is patterned through a patterning process to form a pattern of an active layer in the display motherboard 1, and the active layer film corresponding to the cutting area (the raised portion 12) is removed by etching.

S4: a source-drain metal layer film is deposited on the glass substrate 5 subjected to the above step S3, and the source-drain metal layer film is patterned through a patterning process to form a pattern of a source-drain layer 9 in the raised portion 12 of the cutting area, wherein the source-drain metal layer film on two sides of the source-drain layer 9 is removed by etching, and the source-drain layer 9 in the area corresponding to the raised portion 12 is remained, wherein the width of the source-drain layer 9 is smaller than or equal to that of the gate insulating layer 8.

S5: a planarization layer film is deposited on the glass substrate 5 subjected to the above step S4, and the planarization layer film is patterned through a patterning process to form a pattern of a planarization layer 7 in the raised portion 12 of the cutting area, wherein the planarization layer film on two sides of the planarization layer 7 is removed by etching, and the planarization layer 7 in the area corresponding to the raised portion 12 is remained, wherein the width of the planarization layer 7 is smaller than or equal to that of the source-drain layer 9.

S6: the glass substrate 5 (i.e., the array substrate 11) subjected to the above step S5 and the color filter substrate 6 are coated with sealant 3 thereon, the array substrate 11 and the color filter substrate 6 are aligned and assembled, and the sealant 3 defines a plurality of display panels 2, thus completing the manufacturing of the display motherboard 1.

Optionally, the display motherboard 1 is cut along the above cutting area to form separated display panels 2.

Second Embodiment

This embodiment provides a display panel, which is obtained by cutting the above display motherboard along the raised portion of the cutting area.

Third Embodiment

This embodiment provides a display device, including the above display panel.

It could be understood that the above embodiments are merely exemplary embodiments adopted for describing the principle of the present invention, but the present invention is not limited thereto. Various variations and improvements may be made for those of ordinary skill in the art without departing from the spirit and essence of the present invention, and these variations and improvements are also encompassed within the protection scope of the present invention.

The invention claimed is:

1. A display motherboard, comprising:
a first substrate and a second substrate which are arranged oppositely;
a sealant arranged between the first substrate and the second substrate and used for sealing and adhering of the first substrate and the second substrate, wherein the sealant defines a plurality of display panels arranged in a matrix on the display motherboard; and
a cutting area provided on the first substrate and corresponding to the sealant, wherein the cutting area is provided with a raised portion on one side thereof facing the sealant,
wherein the raised portion comprises a plurality of functional layers laminated successively on the first substrate, and the projection of a functional layer close to the first substrate on the first substrate covers that of the adjacent functional layer away from the first substrate on the first substrate, and
wherein the raised portion comprises a gate layer, a gate insulating layer, and a source-drain layer laminated successively on the first substrate.

2. The display motherboard of claim 1, wherein a cross section of the raised portion in the direction perpendicular to the first substrate is of a trapezoid, and a short bottom edge of the trapezoid is close to the sealant.

3. The display motherboard of claim 2, wherein a bottom angle, away from the sealant, of the trapezoidal cross section of the raised portion in a direction perpendicular to the first substrate is more than or equal to 60° and less than 90°.

4. The display motherboard of claim 1, wherein the functional layer, in contact with the sealant, of the raised portion is a metal or metal oxide layer.

5. The display motherboard of claim 1, wherein widths of the functional layers, in contact with the sealant, of the raised portion between two adjacent display panels are more than 2.5 μm.

6. The display motherboard of claim 1, further comprising grooves on two sides of the raised portion.

7. The display motherboard of claim 6, wherein a side wall of one side, adjacent to the raised portion, of each groove is the one of the raised portion.

8. The display motherboard of claim 7, wherein widths of the bottom edges of the grooves away from the second substrate are more than 2.5 μm.

9. The display motherboard of claim 1, wherein the raised portion further comprises a planarization layer laminated on the source-drain layer.

10. A display panel obtained by cutting the display motherboard of claim 1 along the raised portion of the cutting area.

11. A display device comprising the display panel of claim 10.

* * * * *